(12) United States Patent
Kato

(10) Patent No.: US 12,081,174 B2
(45) Date of Patent: Sep. 3, 2024

(54) DOHERTY AMPLIFIER

(71) Applicant: Mitsubishi Electric Corporation, Tokyo (JP)

(72) Inventor: Katsuya Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 423 days.

(21) Appl. No.: 17/622,028

(22) PCT Filed: Nov. 21, 2019

(86) PCT No.: PCT/JP2019/045643
§ 371 (c)(1),
(2) Date: Dec. 22, 2021

(87) PCT Pub. No.: WO2021/100176
PCT Pub. Date: May 27, 2021

(65) Prior Publication Data
US 2022/0278652 A1 Sep. 1, 2022

(51) Int. Cl.
*H03F 1/02* (2006.01)
*H01L 23/66* (2006.01)
(Continued)

(52) U.S. Cl.
CPC ........... *H03F 1/0288* (2013.01); *H01L 23/66* (2013.01); *H01L 25/072* (2013.01); *H03F 3/195* (2013.01); *H01L 24/48* (2013.01); *H01L 2223/6611* (2013.01); *H01L 2223/6627* (2013.01); *H01L 2223/665* (2013.01);
(Continued)

(58) Field of Classification Search
CPC ................................. H03F 1/0288; H03F 1/07
See application file for complete search history.

(56) References Cited

U.S. PATENT DOCUMENTS

2009/0174482 A1 7/2009 Blednov
2012/0146723 A1 6/2012 Blednov et al.
(Continued)

FOREIGN PATENT DOCUMENTS

JP 2009-539277 A 11/2009
JP 2017-501662 A 1/2017
(Continued)

OTHER PUBLICATIONS

International Search Report issued in PCT/JP2019/045643; mailed Feb. 10, 2020.
(Continued)

*Primary Examiner* — Nelson Garces
(74) *Attorney, Agent, or Firm* — Studebaker & Brackett PC

(57) ABSTRACT

A first transistor chip (3) includes a first drain pad (5). A second transistor chip (4) includes a second drain pad (6). A transmission line (9) and a first capacitor (C1) are formed on a resin substrate (1). A first bonding wire (7) connects the first drain pad (5) and one end of the transmission line (9). A second bonding wire (10) connects the second drain pad (6) and one end of the first capacitor (C1). An output terminal (OUT) is connected to the other end of the transmission line (9) and the other end of the first capacitor (C1). A capacitance value of the first capacitor (C1) is selected so as to cause resonance with inductance of the second bonding wire (10).

8 Claims, 13 Drawing Sheets

(51) Int. Cl.
   H01L 25/07   (2006.01)
   H03F 3/195   (2006.01)
   H01L 23/00   (2006.01)
(52) U.S. Cl.
   CPC ............... *H01L 2223/6672* (2013.01); *H01L 2224/48195* (2013.01); *H01L 2924/30105* (2013.01); *H01L 2924/30107* (2013.01); *H03F 2200/423* (2013.01); *H03F 2200/451* (2013.01)

(56) References Cited

U.S. PATENT DOCUMENTS

| | | |
|---|---|---|
| 2016/0315587 A1 | 10/2016 | Zhang et al. |
| 2018/0159479 A1* | 6/2018 | Wu ........................ H03F 1/0288 |
| 2018/0167042 A1* | 6/2018 | Nagasaku ............ H04B 1/0475 |
| 2021/0126596 A1* | 4/2021 | Wong ................... H05K 1/0243 |
| 2021/0152130 A1* | 5/2021 | Srinidhi Embar .... H03F 1/0288 |
| 2022/0021344 A1* | 1/2022 | Maeda ................... H03F 3/245 |

FOREIGN PATENT DOCUMENTS

| | | | |
|---|---|---|---|
| JP | 2018-074320 A | 5/2018 | |
| KR | 1910896 B1 * | 10/2018 | ........... H03F 1/0288 |
| KR | 101910896 B1 | 10/2018 | |
| WO | 2016/203512 A1 | 12/2016 | |

OTHER PUBLICATIONS

An Office Action; "Notice of Reasons for Refusal," mailed by the Japanese Patent Office on Oct. 5, 2021, which corresponds to Japanese Patent Application No. 2020-159649 with partial English language translation.

An Office Action mailed by the Korean Intellectual Property Office on May 16, 2024, which corresponds to Korean Patent Application No. 10-2022-7015766 and is related to U.S. Appl. No. 17/622,028; with English language translation.

* cited by examiner

DOHERTY AMPLIFIER

FIELD

The present disclosure relates to a Doherty amplifier.

BACKGROUND

In mobile communication, a transmission power amplifier is typically desired to have high efficiency and low distortion. Further, a modulated wave signal having a high peak average power ratio (PAPR) is used to support high-speed and large-capacity communication in recent years. In a case where a signal with a high PAPR is amplified with a power amplifier, the power amplifier is made to operate at low average output power at which a back-off is provided with respect to saturated output power to satisfy standards for distortion. Typically, a back-off amount conflicts with efficiency, and thus, high efficiency cannot be expected in a case where a PAPR is high. However, use of an amplifier called a Doherty amplifier can solve the above-described problem. Thus, Doherty amplifiers are widely employed mainly at communication base stations.

In a Doherty amplifier, a main amplifier which is biased in AB class or B class, and a peak amplifier which is biased in C class are synthesized in parallel using λ/4 lines. The λ/4 lines are positioned at output of one of the amplifiers and also positioned at input of the other of the amplifiers. Upon input of a large signal, two amplifiers operate in a similar manner and are synthesized in phase, and thus, characteristics similar to characteristics of a 2-synthesized amplifier are exhibited, and large saturated power is achieved. Meanwhile, upon input of a small signal, only the main amplifier operates, and the λ/4 line connected on the output side of the main amplifier functions as an impedance inverter, and thus, high efficiency can be achieved by high load impedance. The Doherty amplifier can therefore achieve high efficiency in a wide output power range.

However, the Doherty amplifier has a problem that it is difficult to achieve a wider band due to frequency characteristics of a matching circuit from transistors of the main amplifier and the peak amplifier to a synthesized point. To solve this problem, a Doherty amplifier has been proposed in which a 90-degree delay circuit is equivalently constituted by using parasitic capacitances Cds between source terminals and drain terminals of transistors and a line having a shorter electrical length than a 90-degree delay line. This circuit does not require a matching circuit from the transistors to the synthesized point which has been necessary in related art, so that a wider band can be achieved. Further, a Doherty amplifier has been also proposed in which a bonding wire is used as part of a 90-degree delay circuit, and transistors which are formed on expensive transistor chips, and other circuits which are formed on inexpensive substrates such as resin substrates, are connected with the bonding wire (see, for example, PTL 1). This can reduce cost.

CITATION LIST

Patent Literature

[PTL 1] JP 2017-501662 T

SUMMARY

Technical Problem

However, there is a problem that frequency characteristics of a Doherty amplifier degrade due to inductance of a bonding wire. Specifically, there are two possible cases depending on a position of a synthesized point of signals.

The first case is a case where the synthesized point is located at an and of a pad of a peak amplifier. In this case, two bonding wires of a bonding wire directed to the main amplifier side and a bonding wire directed to an output terminal side are connected to the pad of the peak amplifier. A size of the pad is finite, and thus, load impedance becomes non-uniform depending on positions of transistors which constitute the peak amplifier, which causes unbalance operation of the transistors. The unbalance operation causes decrease in output power, gain and efficiency and causes oscillation. In addition, the above-described two bonding wires are close to each other in a layout, so that mutual inductance occurs, which leads to a problem that a frequency of load impedance deviates.

The second case is a case where the synthesized point is located at an end of a wire pad on a resin substrate. In this case, there is a problem that a frequency of load impedance deviates due to inductance components of the bonding wires. It is desired to improve the frequency deviation and the unbalance operation, because the frequency deviation and the unbalance operation inhibit high-efficiency and wide-band characteristics of the Doherty amplifier.

The present invention has been made to solve the problems as described above and is directed to providing a Doherty amplifier which can achieve high-efficiency and wide-band characteristics.

Solution to Problem

A Doherty amplifier according to the present disclosure includes: a first transistor chip including a first drain pad; a second transistor chip including a second drain pad; a resin substrate; a transmission line formed on the resin substrate; a first capacitor formed on the resin substrate; a first bonding wire connecting the first drain pad and one end of the transmission line, a second bonding wire connecting the second drain pad and one end of the first capacitor; and an output terminal connected to the other end of the transmission line and the other end of the first capacitor, wherein a capacitance value of the first capacitor is selected so as to cause resonance with inductance of the second bonding wire.

Advantageous Effects of Invention

In the present disclosure, a capacitance value of the first capacitor is selected so as to cause resonance with inductance of the second bonding wire. This shifts a synthesized point of signals output from the first and second transistor chips on the resin substrate on which circuits are integrated instead of an end of the second drain pad of the second transistor chip. Thus, frequency characteristics do not degrade even with a configuration where the first and second transistor chips are connected to circuits on the resin substrate using the first and second bonding wires, so that high-efficiency and wide-band characteristics can be achieved.

DESCRIPTION OF EMBODIMENTS

A Doherty amplifier according to the embodiments of the present disclosure will be described with reference to the drawings. The same components will be denoted by the same symbols, and the repeated description thereof may be omitted.

First Embodiment

Figure 1:
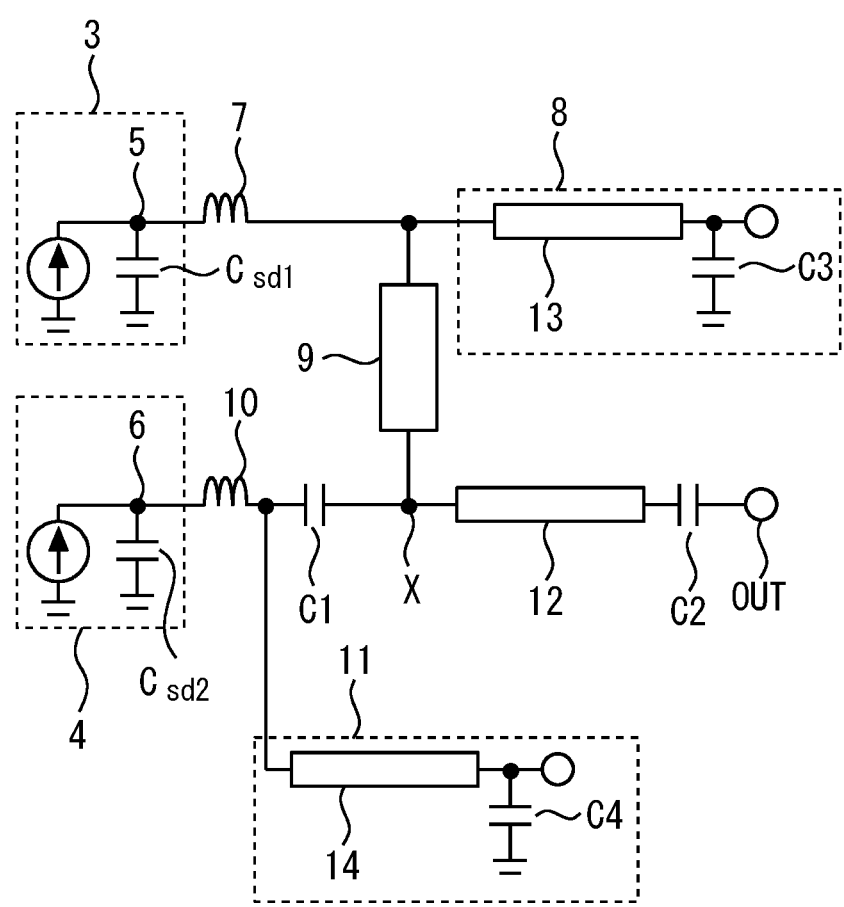
FIG. 1 is a circuit diagram illustrating a Doherty amplifier according to a first embodiment.
Figure 2:
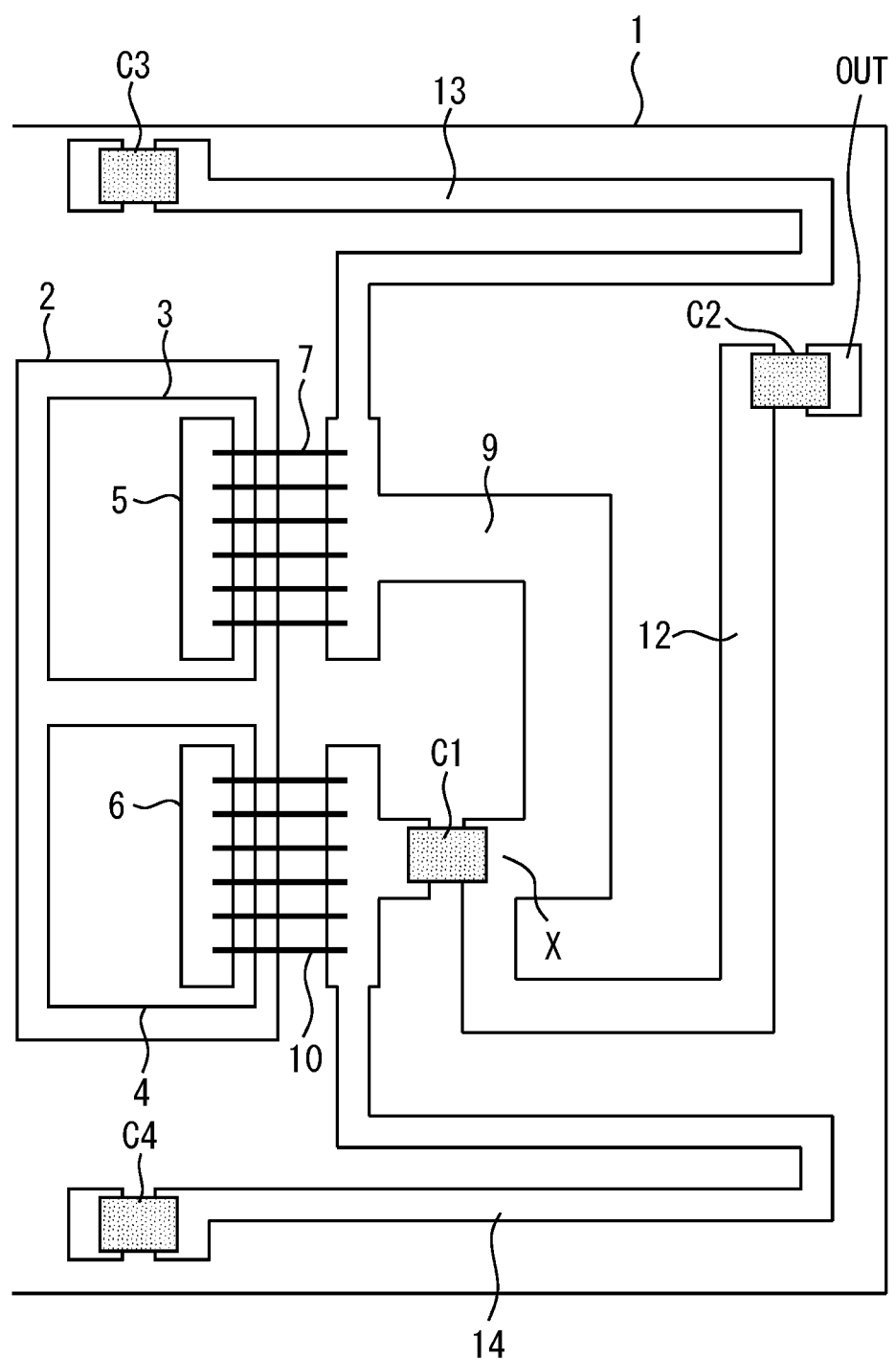
FIG. 2 is a layout diagram illustrating the Doherty amplifier according to the first embodiment.

FIG. 1 is a circuit diagram illustrating a Doherty amplifier according to a first embodiment. FIG. 2 is a layout diagram illustrating the Doherty amplifier according to the first embodiment.

A die pad 2 is formed on a resin substrate 1. Transistor chips 3 and 4 are die-bonded on the die pad 2. The resin substrate 1 is formed with a material such as, for example, FR4. The resin substrate 1 has a substrate thickness of 200 to 500 μm. By selecting a material with a thin substrate thickness, it is possible to lower thermal resistance of the transistor chips 3 and 4. Meanwhile, in a case of a thick resin substrate 1, by increasing density of circuits through multi-layer wiring, it is possible to achieve a smaller size and lower cost.

The transistor chips 3 and 4 are devices such as GaN-HEMT. A main amplifier is formed on the transistor chip 3. A peak amplifier is formed on the transistor chip 4. Note that the transistor chips 3 and 4 may be the same chip.

The transistor chips 3 and 4 respectively include drain pads 5 and 6. The transistor chips 3 and 4 respectively include parasitic capacitances Csd1 and Csd2 between sources and drains. The parasitic capacitances Csd1 and Csd2 include capacitances of the drain pads 5 and 6 as well as intrinsic capacitances of transistors.

The drain pad 5 of the transistor chip 3 is connected to a bias circuit 8 and one end of a transmission line 9 via a bonding wire 7. The drain pad 6 of the transistor chip 4 is connected to one end of a capacitor C1 and a bias circuit 11 via a bonding wire 10. A plurality of the bonding wires 7 and 10 are arranged in parallel in accordance with sizes of the drain pads 5 and 6. Heights of the bonding wires 7 and 10 are approximately 50 μm to 200 μm with respect to surfaces of the transistor chips 3 and 4 and are preferably set to be low.

The other end of the capacitor C1 is connected to the other end of the transmission line 9 and is connected to an output terminal OUT via an impedance conversion circuit 12 and a capacitor C2. The capacitor C1 is, for example, a surface-mounted laminated ceramic capacitor. The bias circuits 8 and 11, the transmission line 9, the impedance conversion circuit 12, the capacitors C1 and C2 and the output terminal OUT are integrated on the resin substrate 1.

The bias circuit 8 includes a 90-degree line 13 and a capacitor C3 for grounding. The bias circuit 11 includes a 90-degree line 14 and a capacitor C4 for grounding. However, configurations of the bias circuits 8 and 11 are not limited to these configurations and only require to have similar functions. While the impedance conversion circuit 12 is also a 90-degree line, the impedance conversion circuit 12 is not limited to this and only requires to have a configuration which can implement desired impedance transformation.

An electrical length and characteristic impedance of the transmission line 9 are set so that an electrical length from the drain pad 5 to the drain pad 6 becomes 90 degrees. A capacitance value of the capacitor C1 is selected so as to cause resonance with equivalent inductance of the bonding wire 10 at a center frequency of an operating frequency. This shifts a synthesized point X of signals output from the transistor chips 3 and 4 on the resin substrate 1 on which circuits are integrated instead of an end of the drain pad 6 of the transistor chip 4.

Figure 3:
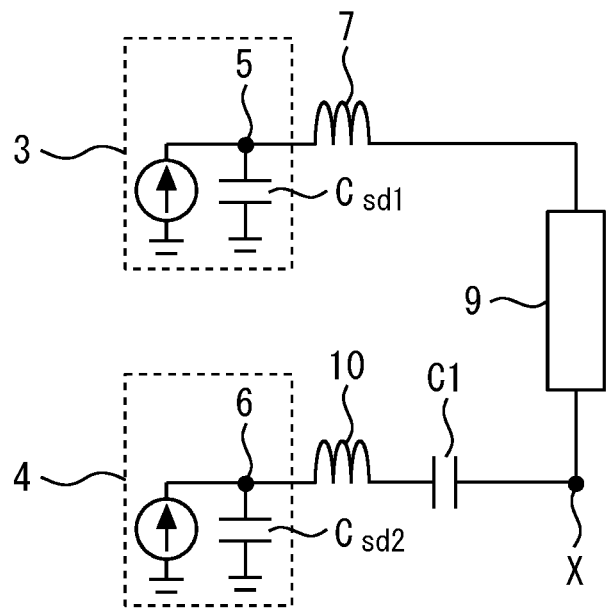
FIG. 3 is an excerpted circuit diagram from the transistors of the Doherty amplifier to the synthesized point according to the first embodiment.
Figure 4:
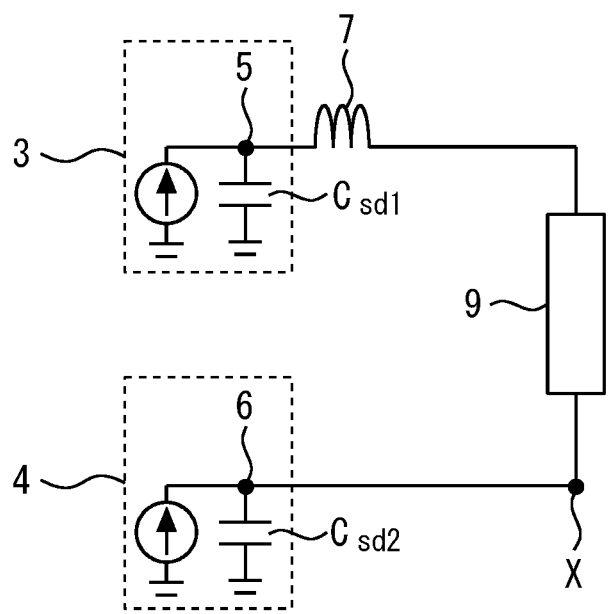
FIG. 4 is a circuit diagram equivalent to FIG. 3.
Figure 5:
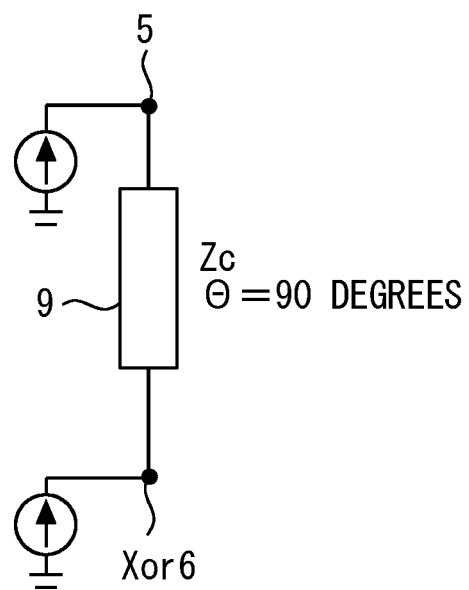
FIG. 5 is a circuit diagram equivalent to FIG. 3.

FIG. 3 is an excerpted circuit diagram from the transistors of the Doherty amplifier to the synthesized point according to the first embodiment. FIG. 4 and FIG. 5 are circuit diagrams equivalent to FIG. 3. The capacitance value of the capacitor C1 is set so as to cause resonance with inductance of the bonding wire 10, and thus, FIG. 3 can be illustrated as FIG. 4. At the equivalent circuit, the synthesized point X and the end of the drain pad 6 are the same node.

By appropriately selecting a length and a line width of the transmission line 9, the circuit can be made equivalent to the circuit illustrated in FIG. 5 in which the electrical length of the transmission line 9 is 90 degrees and which has characteristic impedance Zc. Note that while selection of Zc is typically a design matter, the impedance is often set at impedance corresponding to a real component among power-match complex impedance obtained through LP evaluation, or the like. As can be seen from FIG. 5, an electrical length from the end of the drain pad 5 of the main amplifier to the synthesized point X of signals is 90 degrees, and an electrical length from the end of the drain pad 6 of the peak amplifier to the synthesized point X is 0 degree, which is equivalent to a circuit diagram of a typical Doherty amplifier. Thus, frequency characteristics do not degrade even with a configuration where the transistor chips 3 and 4 are connected to circuits on the resin substrate 1 using the bonding wires 7 and 10, so that high-efficiency and wideband characteristics can be achieved.

Figure 6:
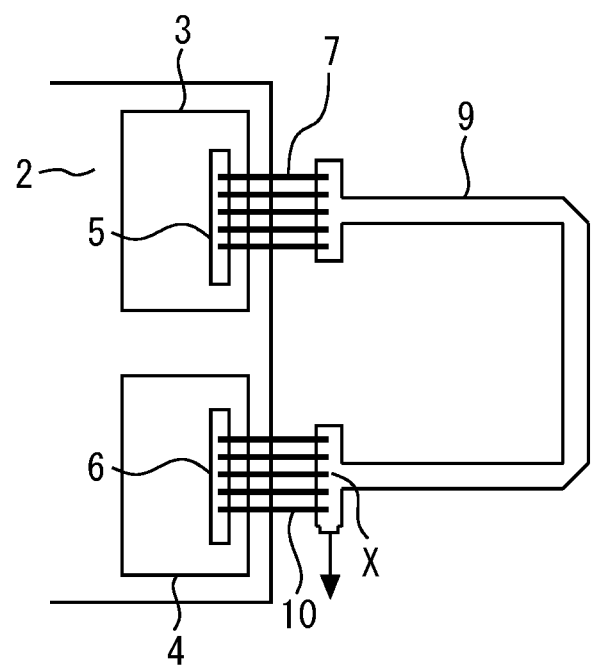
FIG. 6 is a layout diagram illustrating an electromagnetic field calculation model of a configuration according to comparative example 1.
Figure 7:
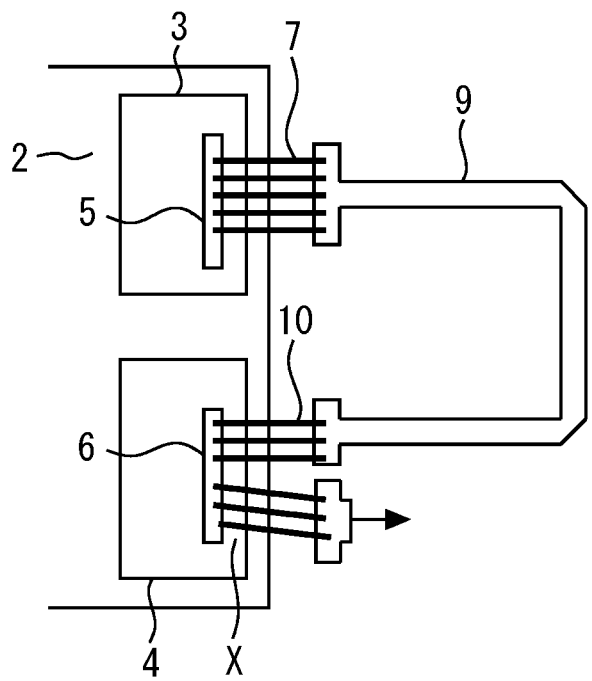
FIG. 7 is a layout diagram illustrating an electromagnetic field calculation model of a configuration according to comparative example 2.
Figure 8:
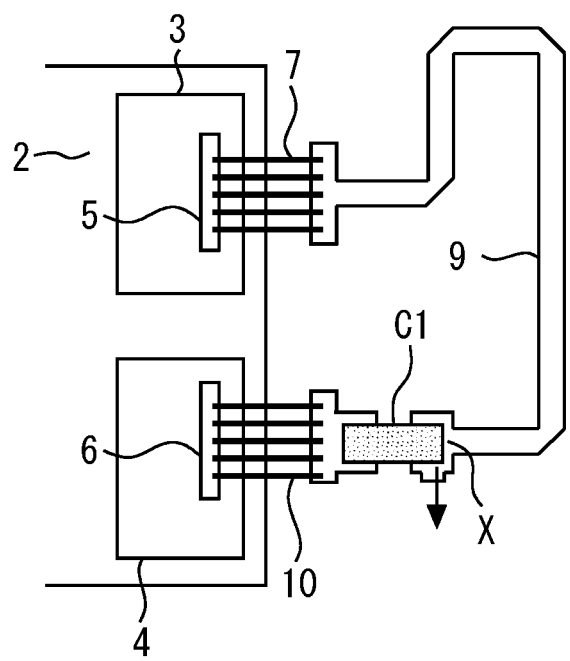
FIG. 8 is a layout diagram illustrating an electromagnetic field calculation model of a configuration according to the first embodiment.

To clarify effects of the first embodiment. RF characteristics of the Doherty amplifier were calculated. FIG. 6 is a layout diagram illustrating an electromagnetic field calculation model of a configuration according to comparative example 1. FIG. 7 is a layout diagram illustrating an electromagnetic field calculation model of a configuration according to comparative example 2. FIG. 8 is a layout diagram illustrating an electromagnetic field calculation model of a configuration according to the first embodiment. Note that the bias circuits 8 and 11, and the impedance conversion circuit 12 are omitted.

FIG. 6 illustrates a case where the synthesized point X is located on the resin substrate. FIG. 7 illustrates a case where the synthesized point X is located on the drain pad 6. In both FIG. 6 and FIG. 7, the electrical length from the drain pad 5 to the drain pad 6 is designed to be 90 degrees. Influence due to the layout is taken into account in calculation using typical electromagnetic field calculation CAD software. The resin substrate 1 has a substrate thickness of 330 μm and has relative permittivity of 4.3. The transmission line 9 has a line width of 150 μm. The transistor chips 3 and 4 have a thickness of 100 μm. Heights of the bonding wires 7 and 10 are 150 μm with respect to upper surfaces of the transistor chips 3 and 4. The bonding wires 7 and 10 are positioned at a pitch of 100 μm. The capacitance value of the capacitor C1 in FIG. 8 is set at 2.9 pF. The line length of the transmission line 9 is adjusted so that the characteristic impedance Zc of an equivalent 90-degree delay circuit become 52Ω.

Figure 9:
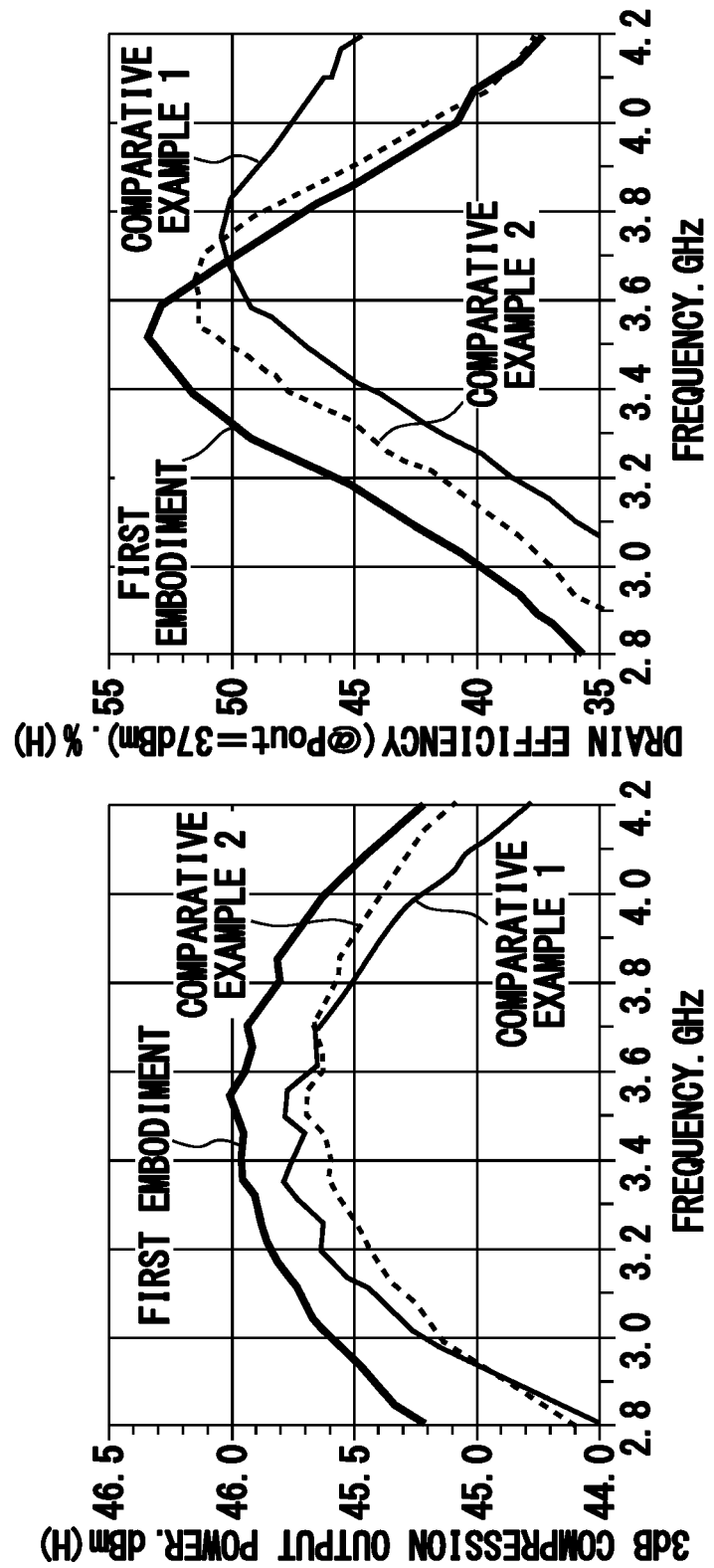
FIG. 9 illustrates frequency characteristics of 3 dB compression output power and drain efficiency of the Doherty amplifier calculated using a non-linear transistor model which is typically used.

FIG. 9 illustrates frequency characteristics of 3 dB compression output power and drain efficiency of the Doherty amplifier calculated using a non-linear transistor model which is typically used. It can be seen from the calculation results that the first embodiment exhibits the widest band and the highest efficiency for both the 3 dB compression output power and the drain efficiency.

Figure 10:
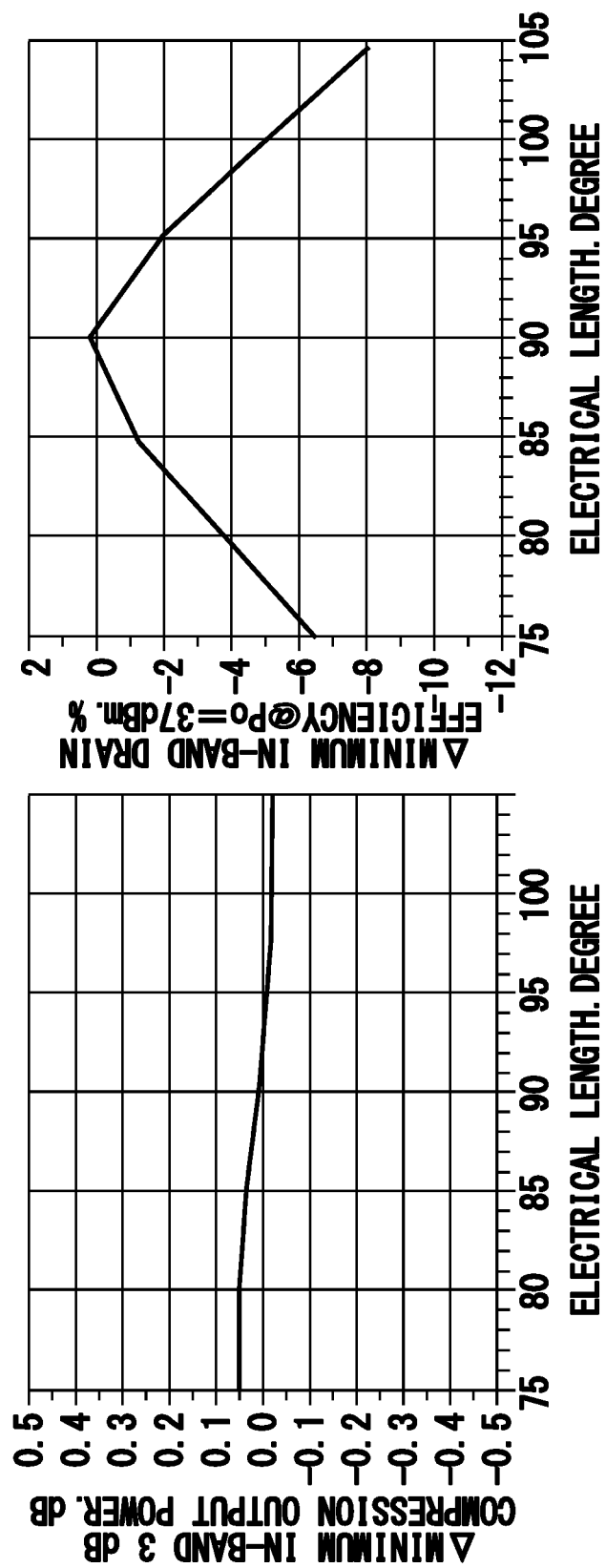
FIG. 10 is a graph indicating minimum values of the 3 dB compression output power and the drain efficiency in a 400 MHz band.

Note that while the electrical length from the drain pad 5 to the drain pad 6 is set at 90 degrees in the present embodiment, actually, sufficiently favorable characteristics can be obtained if the electrical length is approximately set at ±10 degrees. FIG. 10 is a graph indicating minimum values of the 3 dB compression output power and the drain efficiency in a 400 MHz band. It can be seen that if the electrical length is ±10 degrees with respect to 90 degrees, the 3 dB compression output power is sufficiently less affected, and decrease of the drain efficiency is approximately −4 to 5 pts.

Figure 11:
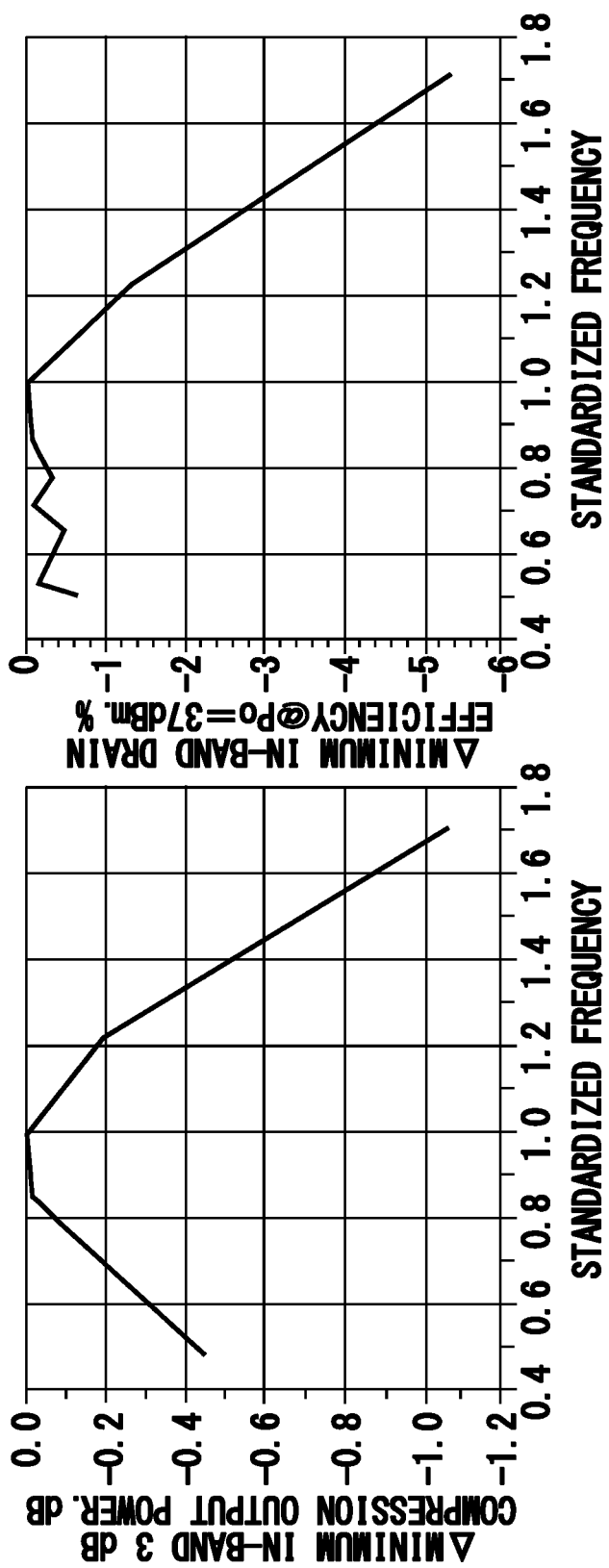
FIG. 11 is a graph indicating minimum values of the 3 dB compression output power and the drain efficiency in a 400 MHz band in a case where the resonance frequency is standardized with the center frequency.

Further, the capacitor C1 and the bonding wire 10 do not have to resonate strictly at the center frequency of the operating frequency, and a wide band and high efficiency can be sufficiently achieved even if a resonance frequency is shifted by approximately ±30% with respect to the center frequency of the operating frequency. FIG. 11 is a graph indicating minimum values of the 3 dB compression output power and the drain efficiency in a 400 MHz band in a case where the resonance frequency is standardized with the center frequency. It can be seen that even if the resonance frequency is shifted by 30%, the 3 dB compression output power degrades by only approximately 0.3 dB, and the drain efficiency decreases by less than 3 pts, so that sufficiently favorable characteristics can be achieved.

Further, while the present embodiment has been described assuming a symmetric Doherty in a case where sizes of two transistors are the same, an asymmetric Doherty in which sizes of transistors are different may be used.

Second Embodiment

Figure 12:
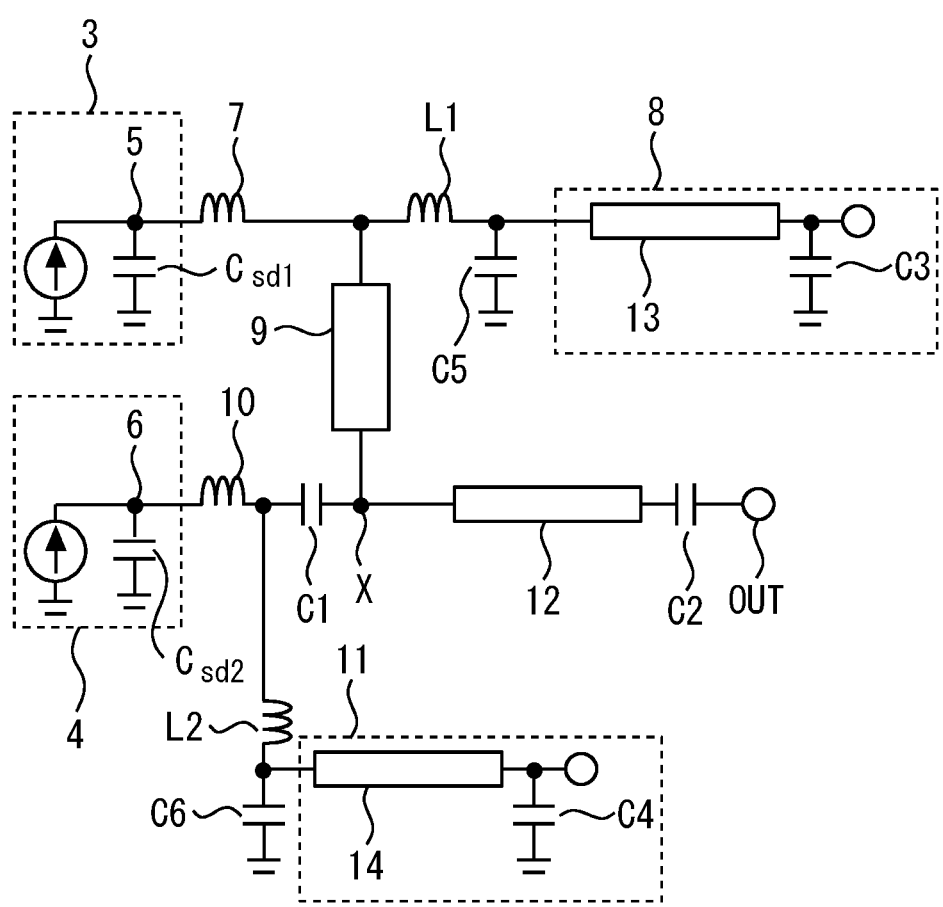
FIG. 12 is a circuit diagram illustrating a Doherty amplifier according to a second embodiment.
Figure 13:
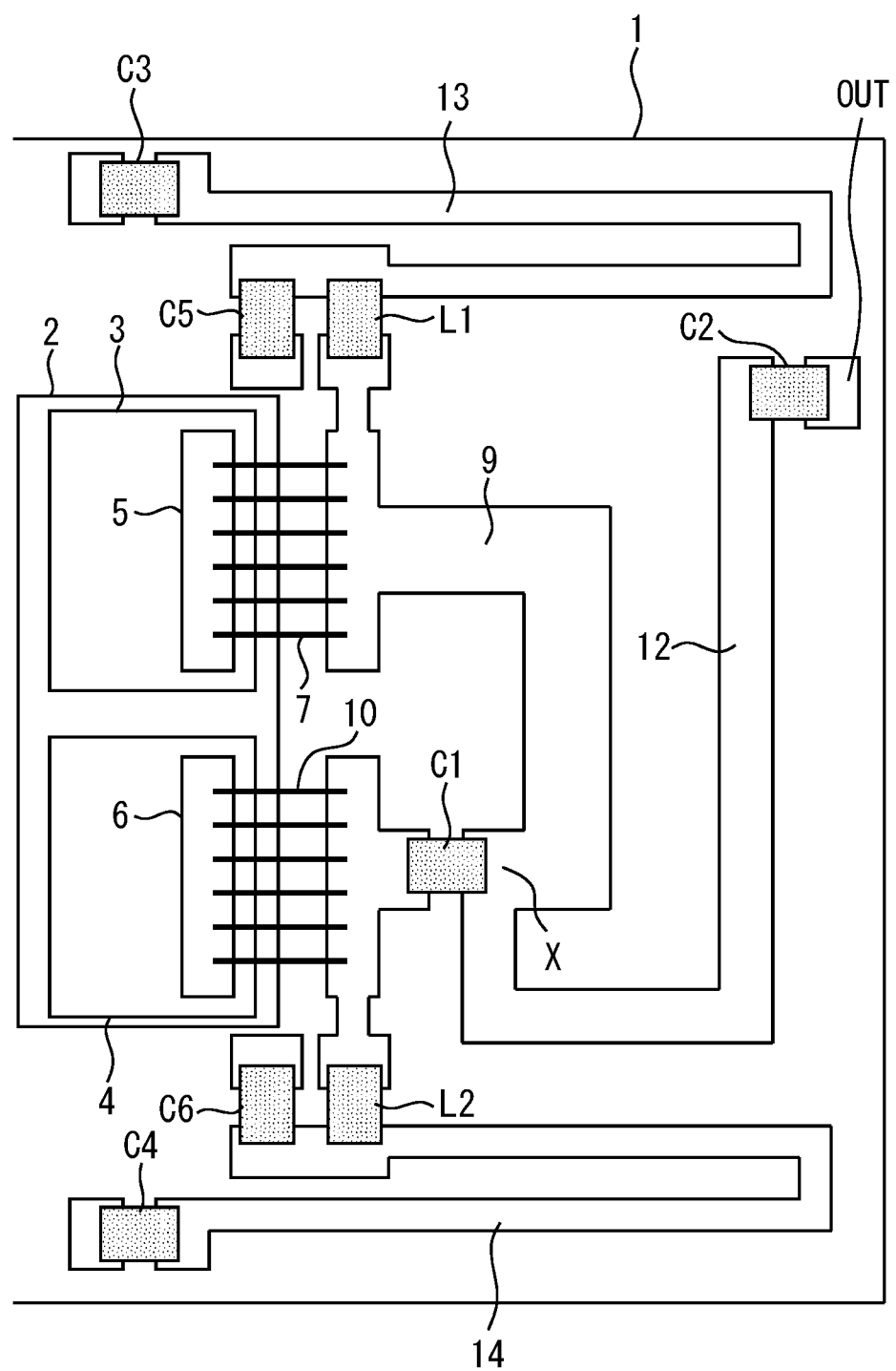
FIG. 13 is a layout diagram illustrating the Doherty amplifier according to the second embodiment.

FIG. 12 is a circuit diagram illustrating a Doherty amplifier according to a second embodiment. FIG. 13 is a layout diagram illustrating the Doherty amplifier according to the second embodiment. Compared to the first embodiment, inductors L1 and L2 and capacitors C5 and C6 are added.

One end of the inductor L1 is connected to a connection point of the bonding wire 7 and the transmission line 9. One end of the inductor L2 is connected to a connection point of the bonding wire 10 and the capacitor C1. The other end of the inductor L1 is grounded via the capacitor C5. The other end of the inductor L2 is grounded via the capacitor C6.

The inductors L1 and L2 are formed as, for example, surface-mounted chip parts or high-impedance lines on the resin substrate 1. As the capacitors C5 and C6, which are provided for RF grounding, capacitances with sufficiently low impedance at the operating frequency are selected. Inductances of the inductors L1 and L2 are set at greater values than values which cause parallel resonance with parasitic capacitances Csd1 and Csd2.

The electrical length from the drain pad 5 to the drain pad 6 requires to be 90 degrees to implement the first embodiment. Thus, there is an upper limit to capacitance values of the parasitic capacitances Csd1 and Csd2 depending on the operating frequency. Thus, in a case where the parasitic capacitances Csd1 and Csd2 are large, the first embodiment cannot be implemented.

In contrast, in the second embodiment, the inductors L1 and L2 are connected in parallel to the parasitic capacitances Csd1 and Csd2, so that it is possible to equivalently reduce an amount of the parasitic capacitance. Thus, even in a case where the parasitic capacitances Csd1 and Csd2 are large, it is possible to achieve characteristics similar to those in the first embodiment. Wide-band characteristics can be achieved by setting the inductances of the inductors L1 and L2 as large as possible within a range in which a circuit can be constituted.

In a case where a bias circuit using a 90-degree line is constituted on the resin substrate 1, even in a layout with an implementable minimum line width, sufficiently high characteristic impedance cannot be achieved, which results in a factor of increase in circuit loss. In contrast, connection of the bias circuits 8 and 11 to a ground point of the inductors L1 and L2 makes it possible to prevent increase in circuit loss due to connection of the bias circuits 8 and 11.

If the capacitors C5 and C6 connected in parallel have sufficiently low impedance in a frequency band which is twice as high as the operating frequency, the bias circuits 8 and 11 may be omitted. In this case, power feeding is set at connection points of the capacitors C5 and C6 and the inductors L1 and L2.

Third Embodiment

Figure 14:
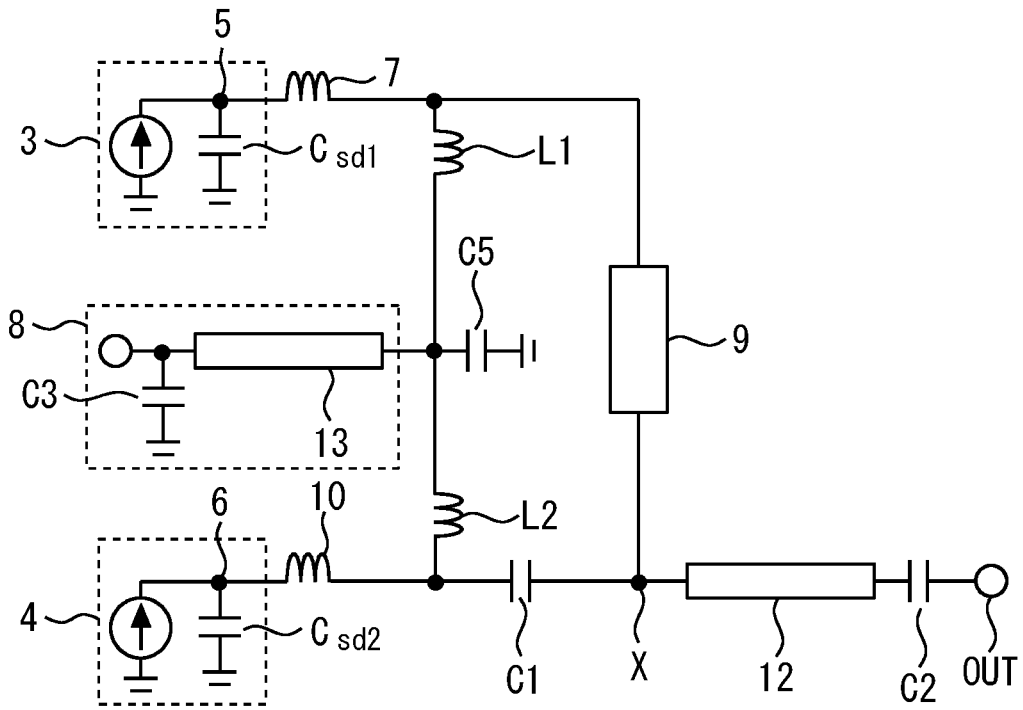
FIG. 14 is a circuit diagram illustrating a Doherty amplifier according to a third embodiment.

FIG. 14 is a circuit diagram illustrating a Doherty amplifier according to a third embodiment. Compared to the second embodiment, the inductors L1 and L2 are grounded at the capacitor C5 in common and the bias circuit 8 is used in common as the bias circuit. This can make the circuit smaller. Other configurations and effects are similar to those in the second embodiment.

Fourth Embodiment

Figure 15:
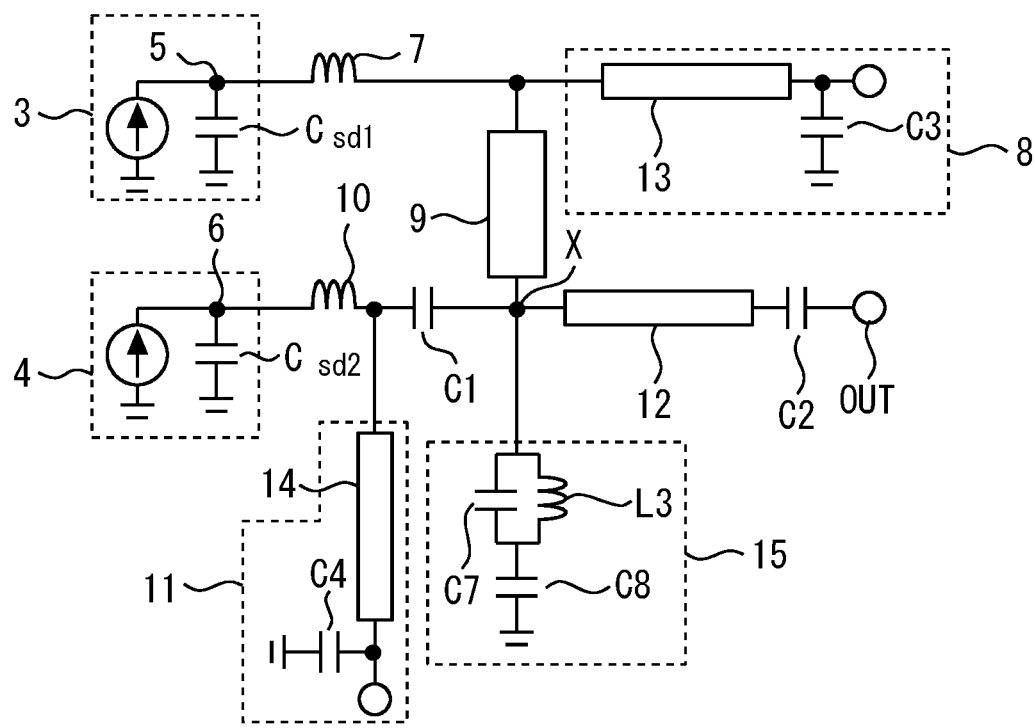
FIG. 15 is a circuit diagram illustrating a Doherty amplifier according to a fourth embodiment.

FIG. 15 is a circuit diagram illustrating a Doherty amplifier according to a fourth embodiment. Compared to the first embodiment, a parallel resonance circuit 15 constituted with capacitors C7 and C8 and an inductor L3 is connected to the synthesized point X. The capacitor C8 is a capacitance for grounding, and a capacitance of sufficiently low impedance at the operating frequency is selected. The capacitor C7 and the inductor L3 are selected so as to parallelly resonate at the center frequency of the operating frequency.

Frequency characteristics of the parallel resonance circuit 15 have polarity reverse to polarity of frequency characteristics of an equivalent 90-degree delay circuit from the drain pad 5 to the synthesized point X. Thus, frequency characteristics of the circuit are reduced. Thus, in the fourth embodiment, wider-band characteristics can be expected compared to the first embodiment. Operation and effects of the present circuit have been described in related art, and thus, details thereof will be omitted. To obtain the effects, the parallel resonance circuit 15 requires to be connected to the synthesized point of signals. Thus, the fourth embodiment is advantageous over related art in that the fourth embodiment can be implemented without causing unbalance operation because the synthesized point is located not at the end of the drain pad, but on the resin substrate 1.

Figure 16:
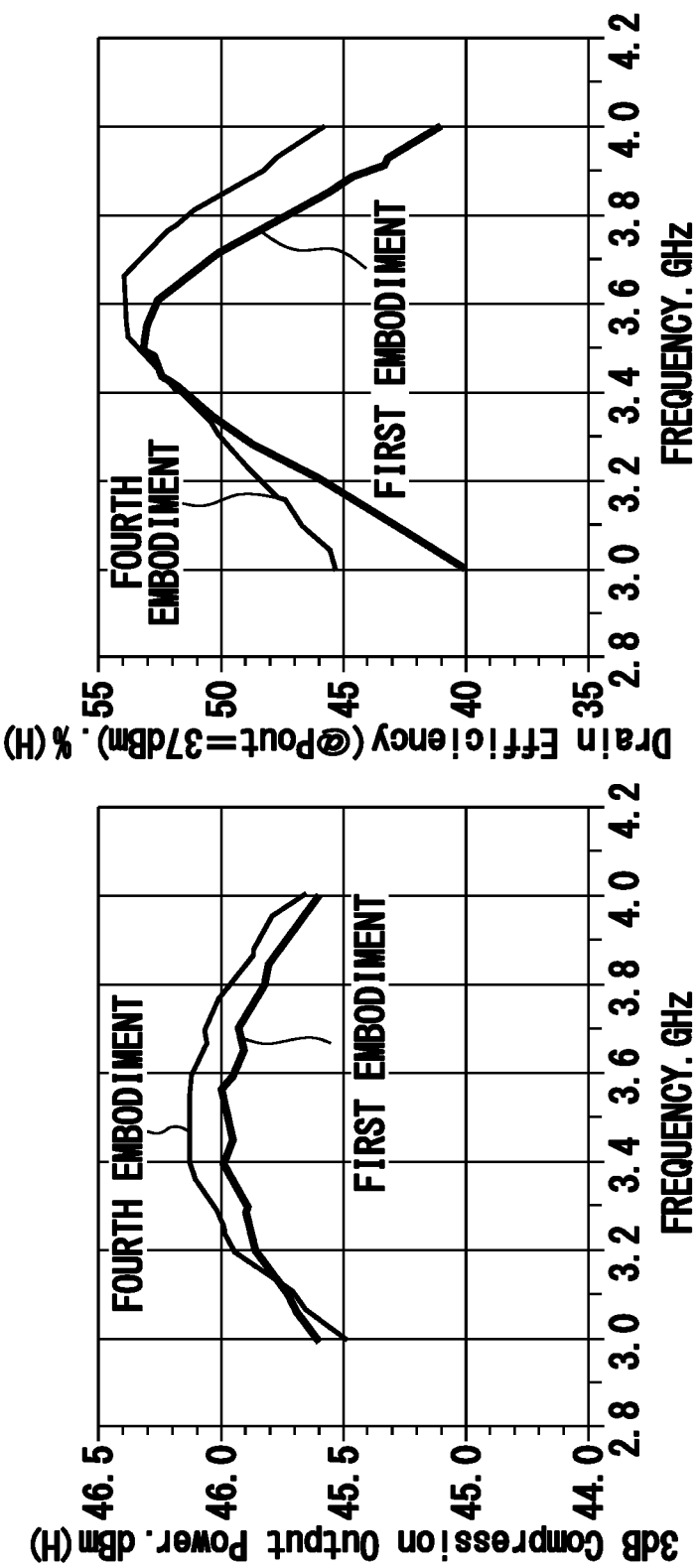
FIG. 16 is a graph indicating comparison of the 3 dB compression output power and the drain efficiency between the first embodiment and the fourth embodiment.

To clarify the effects of the fourth embodiment, RF characteristics of the Doherty amplifier were calculated. FIG. 16 is a graph indicating comparison of the 3 dB compression output power and the drain efficiency between the first embodiment and the fourth embodiment. In the fourth embodiment, the capacitor C7 is 1.67 pF, the capacitor C8 is 7 pF, and the inductor L3 is 1.294 nH. It can be seen that the fourth embodiment achieves a wider-band and higher-efficiency both for the 3 dB compression output power and the drain efficiency compared to the first embodiment.

Note that the present embodiment can be combined with the configuration of the second embodiment or the third embodiment. Further, in a case where the capacitor C7 is constituted with surface-mounted chip capacitances, by connecting two chip capacitances in parallel, it is possible to reduce circuit loss. Capacitance values of the two chip capacitances are selected so as to be the same in total as the capacitance value of the capacitor C7.

Fifth Embodiment

Figure 17:
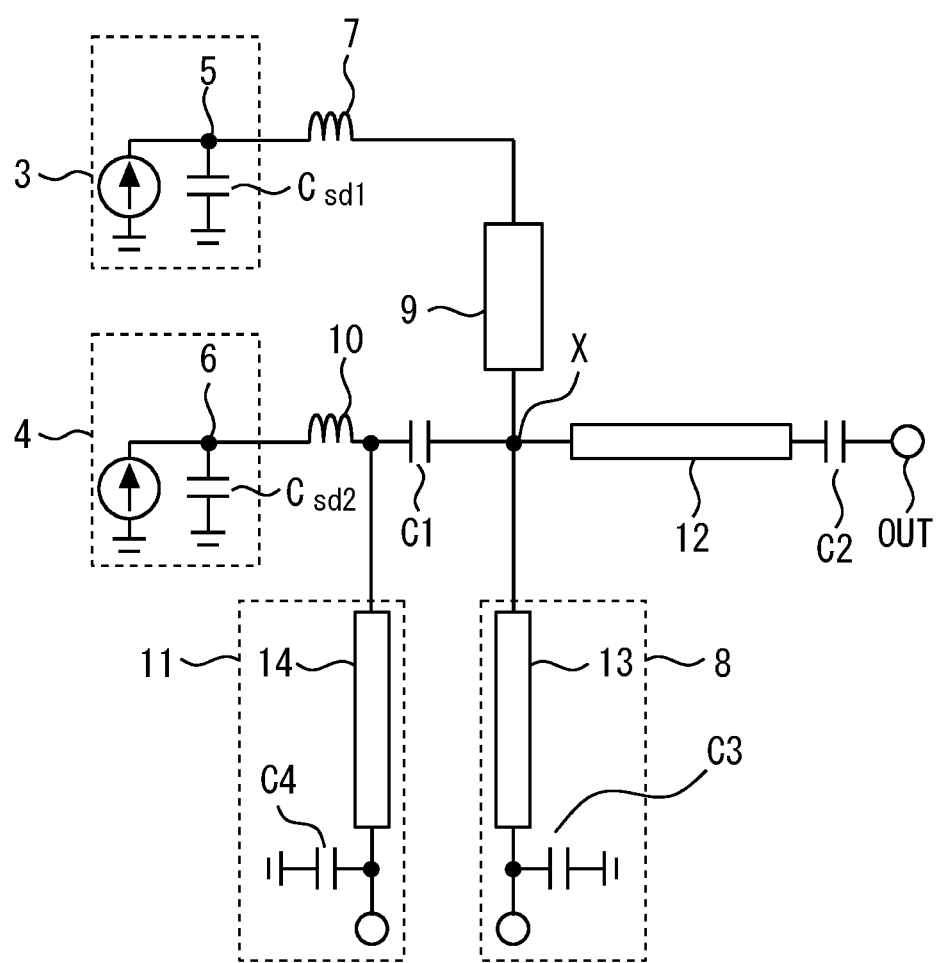
FIG. 17 is a circuit diagram illustrating a Doherty amplifier according to a fifth embodiment.

FIG. 17 is a circuit diagram illustrating a Doherty amplifier according to a fifth embodiment. Compared to the first embodiment, a connection position of the bias circuit 8 is changed to the synthesized point X. Impedance of the bias circuit 8 from the synthesized point X exhibits frequency characteristics similar to frequency characteristics of the parallel resonance circuit in the fourth embodiment. Thus, the frequency characteristics have polarity reverse to frequency characteristics of the 90-degree delay circuit from the drain pad 5 to the synthesized point X, so that frequency characteristics of the circuit are reduced. It is therefore possible to obtain effects similar to the effects in the fourth embodiment and achieve a smaller size by deleting the parallel resonance circuit in the fourth embodiment. Note that the present embodiment can be combined with the configuration of the second embodiment.

REFERENCE SIGNS LIST 1 resin substrate, 3 transistor chip (first transistor chip), 4 transistor chip (second transistor chip), 5 drain pad (first drain pad), 6 drain pad (second drain pad), 7 bonding wire (first bonding wire), 8 bias circuit (first bias circuit), 9 transmission line, 10 bonding wire (second bonding wire), 11 bias circuit (second bias circuit), 15 parallel resonance circuit, C1 capacitance (first capacitor), C5 capacitance (second capacitor), C6 capacitance (third capacitor), L1 inductor (first inductor), L2 inductor (second inductor), OUT output terminal

The invention claimed is:

1. A Doherty amplifier comprising:
a first transistor chip including a first drain pad;
a second transistor chip including a second drain pad;
a resin substrate;
a transmission line formed on the resin substrate;
a first capacitor formed on the resin substrate;
a first bonding wire connecting the first drain pad and one end of the transmission line;
a second bonding wire connecting the second drain pad and one end of the first capacitor; and
an output terminal connected to the other end of the transmission line and the other end of the first capacitor,
wherein a parasitic capacitance between a source and a drain of the first transistor chip, a parasitic capacitance between a source and a drain of the second transistor chip, the transmission line and the first bonding wire constitute an equivalent 90-degree delay circuit, and
a capacitance value of the first capacitor is selected so as to cause resonance with inductance of the second bonding wire.

2. The Doherty amplifier according to claim 1, wherein a resonance frequency of the first capacitor and the second bonding wire is within ±30% of a center frequency of an operating frequency of the Doherty amplifier.

3. The Doherty amplifier according to claim 1, further comprising:
a first bias circuit connected to one end of the transmission line; and
a second bias circuit connected to one end of the first capacitor.

4. The Doherty amplifier according to claim 1, further comprising:
a first inductor including one end connected to a connection point of the first bonding wire and the transmission line and the other end grounded via the second capacitor; and
a second inductor including one end connected to a connection point of the second bonding wire and the first capacitor and the other end grounded via the third capacitor,
wherein the first inductor has an inductance greater than an inductance which causes parallel resonance with the parasitic capacitance between the source and the drain of the first transistor chip at an operating frequency,
the second inductor has an inductance greater than an inductance which causes parallel resonance with the parasitic capacitance between the source and the drain of the second transistor chip at the operating frequency, and
the first inductor, the second inductor, the parasitic capacitance between the source and the drain of the first transistor chip, the parasitic capacitance between the source and the drain of the second transistor chip, the transmission line and the first bonding wire constitute the equivalent 90-degree delay circuit.

5. The Doherty amplifier according to claim 4, further comprising:
a first bias circuit connected to the other end of the first inductor; and a second bias circuit connected to the other end of the second inductor.

6. The Doherty amplifier according to claim 1, further comprising:
- a first inductor including one end connected to a connection point of the first bonding wire and the transmission line and the other end grounded via the second capacitor;
- a second inductor including one end connected to a connection point of the second bonding wire and the first capacitor and the other end grounded via the second capacitor; and
- a bias circuit connected to the other end of the first inductor and the other end of the second inductor,
- wherein the first inductor has an inductance greater than an inductance which causes parallel resonance with the parasitic capacitance between the source and the drain of the first transistor chip at an operating frequency,
- the second inductor has an inductance greater than an inductance which causes parallel resonance with the parasitic capacitance between the source and the drain of the second transistor chip at the operating frequency, and
- the first inductor, the second inductor, the parasitic capacitance between the source and the drain of the first transistor chip, the parasitic capacitance between the source and the drain of the second transistor chip, the transmission line and the first bonding wire constitute the equivalent 90-degree delay circuit.

7. The Doherty amplifier according to claim 1, further comprising a parallel resonance circuit connected between a ground point and each of the other end of the transmission line and the other end of the first capacitor and parallelly resonating at a center frequency of an operating frequency of the Doherty amplifier.

8. The Doherty amplifier according to claim 1, further comprising:
- a first bias circuit connected to the other end of the transmission line and the other end of the first capacitor; and
- a second bias circuit connected to one end of the first capacitor.

* * * * *